United States Patent
Dabrowski

(10) Patent No.: US 11,336,244 B2
(45) Date of Patent: May 17, 2022

(54) FULLY DIFFERENTIAL RAIL-TO-RAIL OUTPUT AMPLIFIER WITH INVERTER-BASED INPUT PAIR

(71) Applicant: Brookhaven Science Associates, LLC, Upton, NY (US)

(72) Inventor: Mieczyslaw M. Dabrowski, Port Jefferson, NY (US)

(73) Assignee: Brookhaven Science Associates, LLC, Upton, NY (US)

(*) Notice: Subject to any disclaimer, the term of this patent is extended or adjusted under 35 U.S.C. 154(b) by 0 days.

(21) Appl. No.: 16/925,431

(22) Filed: Jul. 10, 2020

(65) Prior Publication Data

US 2021/0013851 A1    Jan. 14, 2021

Related U.S. Application Data

(60) Provisional application No. 62/872,945, filed on Jul. 11, 2019.

(51) Int. Cl.
*H03F 3/45* (2006.01)

(52) U.S. Cl.
CPC ..... *H03F 3/45206* (2013.01); *H03F 3/45192* (2013.01); *H03F 3/45475* (2013.01); *H03F 3/45246* (2013.01); *H03F 2203/45028* (2013.01)

(58) Field of Classification Search
CPC ............. H03F 3/45206; H03F 3/45475; H03F 3/45192; H03F 2203/45028; H03F 3/3022; H03F 2203/45134; H03F 2203/45392; H03F 3/45659; H03F 3/45246
See application file for complete search history.

(56) References Cited

U.S. PATENT DOCUMENTS 9,660,585 B2    5/2017  Mittal et al.
10,187,024 B2*  1/2019  Tsai ................... H03F 3/45228

OTHER PUBLICATIONS

Sansen, Willy, "Class AB and driver amplifiers", dated Oct. 2005, pp. 121-1251.
Renirie et al., "Simplified Class AB Control Circuits for Rail to Rail Output Stages of Operational Amplifiers", Sep. 21-23, 1992, pp. 183-186.
Beasley et al., "Transistor Level Implementation of CMOS Combinational Logic Circuits", the Technology Interface /Spring 97, http://tiij.org/issues/issues/spring97/electronics/cmos/cmostran.html, dated Mar. 15, 2019, 13 pages.

* cited by examiner

*Primary Examiner* — Jung Kim
(74) *Attorney, Agent, or Firm* — Dorene M. Price

(57) ABSTRACT

A fully differential rail-to-rail-output amplifier includes a differential input inverter pair, folded cascode pair, class AB control pair, and class AB output rail-to-rail pair. A drain associated with the folded cascode pair is operatively coupled to the class AB control pair, and the drain associated with the folded cascode pair is unconnected to the current source associated with the class AB control pair. A method of providing fully differential rail-to-rail-output amplification includes coupling a folded cascode pair operatively to a differential input inverter pair, coupling a drain associated with the folded cascode pair operatively to a class AB control pair, and coupling a class AB output rail-to-rail pair operatively to the class AB control pair.

19 Claims, 5 Drawing Sheets

FULLY DIFFERENTIAL RAIL-TO-RAIL OUTPUT AMPLIFIER WITH INVERTER-BASED INPUT PAIR

CROSS-REFERENCE TO RELATED APPLICATION

This application claims the benefit of, and priority to, U.S. Provisional Application No. 62/872,945, filed Jul. 11, 2019, the disclosure of which is incorporated herein by reference in its entirety.

STATEMENT OF GOVERNMENT LICENSE RIGHTS

The present invention was made with government support under contract number DE-SC0012704 awarded by the U.S. Department of Energy. The United States government may have certain rights in this invention.

BACKGROUND

The disclosed embodiments generally relate to a circuit that reduces electronic noise associated with a fully differential amplifier.

SUMMARY

The disclosed embodiments relate to a fully differential rail-to-rail-output amplifier, which includes a differential input inverter pair, folded cascode pair, class AB control pair, and class AB output rail-to-rail pair. The differential input inverter pair includes at least one of a negative-channel or n-type channel metal-oxide semiconductor (NMOS) transistor, positive-channel or p-type channel metal-oxide semiconductor (PMOS) transistor, top current source, and/or bottom current source. The folded cascode pair includes at least one of a NMOS transistor and/or PMOS transistor. The folded cascode pair is operatively coupled to the differential input inverter pair. The class AB control pair includes at least one of a NMOS transistor, PMOS transistor, and/or current source. A drain associated with the folded cascode pair is operatively coupled to the class AB control pair, and the drain associated with the folded cascode pair is unconnected to the current source associated with the class AB control pair. The class AB output rail-to-rail pair includes at least one of a NMOS transistor and/or PMOS transistor, and the class AB output rail-to-rail pair is operatively coupled to the class AB control pair.

The fully differential rail-to-rail-output amplifier may include a top load current source operatively coupled to the folded cascode pair, and the top load current source may include at least one PMOS transistor. The fully differential rail-to-rail-output amplifier may include a bottom load current source operatively coupled to the folded cascode pair, and the bottom load current source may include at least one NMOS transistor.

The fully differential rail-to-rail-output amplifier may include a common mode feedback circuit operatively coupled to the top load current source, and the common mode feedback circuit may include at least one of a differential-input single-ended output amplifier and/or common mode detection circuit. The common mode feedback circuit may be operatively coupled to the bottom load current source, and the common mode feedback circuit may include at least one of a differential-input single-ended output amplifier and/or common mode detection circuit.

The differential input inverter pair may include at least two NMOS transistors and/or at least two PMOS transistors. Sources of the PMOS transistors associated with the differential input inverter pair may be operatively coupled to the top current source, and the top current source may be operatively coupled to a power supply. Sources of the NMOS transistors associated with the differential input inverter pair may be operatively coupled to the bottom current source, and the bottom current source may be operatively coupled to ground. Drains of the PMOS transistors associated with the differential input inverter pair and drains of the NMOS transistors associated with the differential input inverter pair may be operatively coupled to the folded cascode pair, and gates of at least one of the PMOS transistors associated with the differential input inverter pair and at least one of the NMOS transistors associated with the differential input inverter pair may be operatively coupled together.

The folded cascode pair may include at least two NMOS transistors, and sources of the NMOS transistors associated with the folded cascode pair may be operatively coupled to the differential input inverter pair. At least one drain of the NMOS transistors associated with the folded cascode pair may be operatively coupled to the class AB control pair. The folded cascode pair may include at least two PMOS transistors, and sources of the PMOS transistors associated with the folded cascode pair may be operatively coupled to the differential input inverter pair. At least one drain of the PMOS transistors associated with the folded cascode pair may be operatively coupled to the class AB control pair.

A source of the PMOS transistor associated with the class AB control pair and a drain of the NMOS transistor associated with the class AB control pair may be operatively coupled to the folded cascode pair, and a drain of the PMOS transistor associated with the class AB control pair and a source of the NMOS transistor associated with the class AB control pair may be operatively coupled to the current source associated with the AB control pair. The current source associated with the class AB control pair may be operatively coupled to ground. A source of the PMOS transistor associated with the class AB control pair and a drain of the NMOS transistor associated with the class AB control pair may be operatively coupled to the folded cascode pair, and a drain of the PMOS transistor associated with the class AB control pair and a source of the NMOS transistor associated with the class AB control pair may be operatively coupled to the current source associated with the AB control pair. The current source associated with the class AB control pair may be operatively coupled to a power supply.

A drain of the PMOS transistor associated with the class AB output rail-to-rail pair may be operatively coupled to a drain of the NMOS transistor associated with the class AB output rail-to-rail pair, and a gate of the PMOS transistor associated with the class AB output rail-to-rail pair may be operatively coupled to the class AB control pair. A gate of the NMOS transistor associated with the class AB output rail-to-rail pair may be operatively coupled to the class AB control pair.

The top load current source may include at least two PMOS transistors, and gates of the PMOS transistors associated with the top load current source may be operatively coupled together. Sources of the PMOS transistors associated with the top load current source may be operatively coupled to a power supply, and drains of the PMOS transistors associated with the top load current source may be operatively coupled to the folded cascode pair. The bottom load current source may include at least two NMOS transistors, and gates of the NMOS transistors associated with the bottom load current source may be operatively coupled together. Sources of the NMOS transistors associated with the top load current source may be operatively coupled to ground, and drains of the NMOS transistors associated with the top load current source may be operatively coupled to the folded cascode pair.

The common mode detection circuit may be operatively coupled to drains of the PMOS transistor and the NMOS transistor associated with the class AB output rail-to-rail pair and the differential-input single-ended output amplifier, and the differential-input single-ended output amplifier may be operatively coupled to the top load current source and a direct current (DC) common mode voltage $V_{CM}$. The common mode detection circuit may be operatively coupled to drains of the PMOS transistor and NMOS transistor associated with the class AB output rail-to-rail pair and the differential-input single-ended output amplifier, and the differential-input single-ended output amplifier may be operatively coupled to the bottom load current source and a direct current (DC) common mode voltage $V_{CM}$.

The disclosed embodiments further relate to a method of providing fully differential rail-to-rail-output amplification, which includes coupling a folded cascode pair operatively to a differential input inverter pair, coupling a drain associated with the folded cascode pair operatively to a class AB control pair, and coupling a class AB output rail-to-rail pair operatively to the class AB control pair. The folded cascode pair includes at least one of a NMOS transistor and/or PMOS transistor. The differential input inverter pair includes at least one of a NMOS transistor, PMOS transistor, top current source, and/or bottom current source. A drain associated with the folded cascode pair is unconnected to a current source associated with the class AB control pair, and the class AB control pair includes at least one of a NMOS transistor, PMOS transistor, and/or current source. The class AB output rail-to-rail pair includes at least one of a NMOS transistor and/or PMOS transistor.

Other embodiments will become apparent from the following detailed description considered in conjunction with the accompanying drawings. It is to be understood, however, that the drawings are designed as an illustration only and not as a definition of the limits of any of the embodiments.

DETAILED DESCRIPTION

Electronic noise is a factor in limiting the resolution of an electronic system. Fully differential amplifiers are used in medical imagers, particle detectors, biomedical circuits, and other technologies. To reduce the noise of the electronic system, techniques may require a substantial increase in power consumption. However, some applications have a limit on power consumption and, as a result, a limit on resolution of the electronic system. Accordingly, a circuit that can reduce electronic noise, increase bandwidth associated with fully differential amplifiers, and/or reduce power consumption, while maintaining a specified level of resolution and/or performance would be highly beneficial.

Embodiments of a circuit architecture are described herein that are capable of reducing electronic noise associated with fully differential amplifiers by at least 3 dB, while maintaining the same and/or similar power consumption, thereby enabling resolution associated with the fully differential amplifier to be increased by at least 3 dB.

Figure 1:
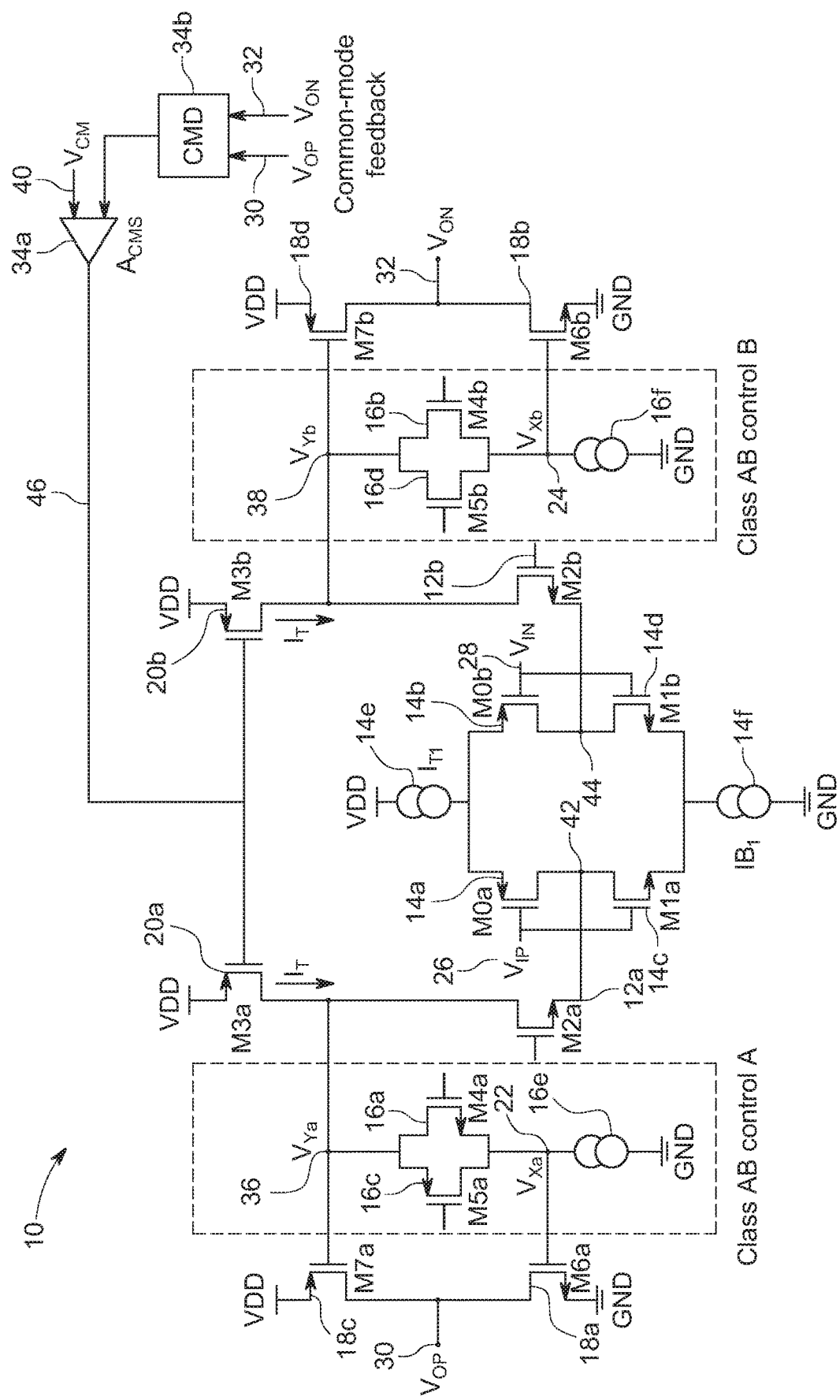
FIG. 1 is a block diagram of a two-stage fully differential rail-to-rail-output amplifier with differential input inverter pairs, folded cascode pair, and class AB control pairs in a first amplifying stage, followed by a class AB output rail-to-rail stage, wherein the folded cascode pair is realized with NMOS-type transistors.

FIG. 1 shows a block diagram of a two-stage fully differential rail-to-rail-output amplifier 10 including a folded cascode pair 12a-b, differential input inverter pairs 14a-d, and class AB control pairs 16a-f in a first amplifying stage, followed by class AB output rail-to-rail pairs 18a-c, in which the folded cascode pair 12a-b is realized with NMOS technology.

As used herein, the first stage of the subject architecture includes transistors M0 14a-b, M1 14c-d, M2 12a-b, M3 20a-b, M4 16a-b, M5 16c-d, and current sources $I_{ABa}$ 16e, $I_{ABb}$ 16f. In other words, the first stage includes the input pairs (transistors M0a 14a, M1a 14c, M0b 14b, M1b 14d), folded cascode pair (transistors M2a 12a, M2b 12b), a top load current source (transistors M3a 20a, M3b 20b), a class AB control pairs (transistors M4a 16a, M5a 16c, M4b 16b, M5b 16d), and input pair biasing current sources $I_{ABa}$ 16e, $I_{ABb}$ 16f. As used herein, a second stage of the subject architecture includes transistors M6 18a-b, M7 18c-d. That is, the second stage includes the class AB output rail-to-rail pair (transistors M6a 18a, M7a 18c, M6b 18b, M7b 18d).

The input pairs 14a-d include one pair of transistors that is designated as, for example, M0a 14a and M1a 14c, and another pair of transistors that is designated as, for example, M0b 14b and M1b 14d. The folded-cascade pair 12a-b directs current to a specified pair of transistors, which is designated as, for example, M2a 12a and M2b 12b. The class AB control pairs are used for one class AB control, which is designated as, for example, M4a 16a and M5a 16c, and another class AB control, which is designated as, for example, M4b 16b and M5b 16d. One of the class AB control pairs, such as M4a 16a and M5a 16c, includes node $V_{xa}$ 22, and the other class AB control pair, such as M4b 16b and M5b 16d, includes node $V_{xb}$ 24. The subject circuit includes a modification to the class AB control pairs 16a-f, in which (i) nodes $V_{xa}$ 22, $V_{xb}$ 24 and drains of the folded cascode pair M2a 12a or M2b 12b are disconnected or unconnected, which are then able to operatively coupled to one or more external circuits that generate an appropriate bias voltage using techniques known in the art, (ii) current sources $I_{ABa}$ 16e, $I_{ABb}$ 16f are added to the circuit, and nodes $V_{xa}$ 22, $V_{xb}$ 24 and current sources $I_{ABa}$ 16e, $I_{ABb}$ 16f are connected to the same ground, and (iii) drains of the folded cascode pair M2a 12a, M2b 12b are connected to the top load current source M3a 20a, M3b 20b, as shown in FIG. 1.

A voltage VDD is a power supply, $V_{IP}$ 26 is a positive input voltage, $V_{IN}$ 28 is a negative input voltage, $V_{OP}$ 30 is a positive output voltage, and $V_{ON}$ 32 is a negative output voltage.

Embodiments of the subject fully differential output rail-to-rail amplifier 10 disclosed herein include a combination of the differential input inverter pairs (or input pairs) 14a-d, folded-cascode pair 12a-b, class AB control pairs 16a-f, and class AB output rail-to-rail pairs 18a-d. In addition, the subject amplifier comprises current sources 16e-f, 14e-f, and 20a-b biasing the circuit, as well as a common mode feedback circuit 34a-b.

The common mode feedback circuit 34a-b includes a common-mode detection or common-mode sensing circuit 34b that can be implemented using a variety of techniques know in the art. For example, in one embodiment, the common-mode sensing circuit 34b is implemented using a set of two (2) capacitors and two (2) resistors electrically coupled in parallel. The common mode feedback circuit 34a-b also includes a differential-input single-ended output amplifier 34a. The differential-input single-ended output amplifier 34a can also be implemented using a variety of techniques known in the art. For example, in one embodiment, the differential-input single-ended output amplifier 34a is implemented using a set of three (3) NMOS and two (2) PMOS transistors.

The first stage of the subject amplifier 10 includes the differential inverter input pairs 14a-d, folded cascode pair 12a-b, class AB control pairs 16a-f, and top load current source 20a-b that biases the class AB control pairs 16a-f.

The differential inverter input pairs 14a-d include a set of PMOS transistors 14a-b and a set of NMOS transistors 14c-d generating signal currents upon application of a differential stimuli to the amplifier's input terminals 26, 28. The differential inverter input pairs 14a-d are coupled to the amplifier's positive and negative inputs 26, 28, top and bottom bias current sources 14e-f, and sources of the folded-cascode pair 12a-b.

A top bias current source 14e biases the differential inverter input pairs 14a-d. The top bias current source 14e is coupled between a power supply VDD and sources of the PMOS transistors 14a-b.

A bottom bias current source 14f biases the differential inverter input pair 14a-d and folded-cascode pair 12a-b. The bottom bias current source 14f is coupled between sources of the NMOS transistors 14c-d and ground.

The folded-cascode pair 12a-b provides a low impedance path for the signal current. The folded-cascode pair 12a-b is coupled to drains of the differential inverter input pairs 14a-d, inputs of the class AB control pairs 16a-f, and the top load current source 20a-b.

The top load current source 20a-b (i) converts signal currents generated in the differential inverter input pairs 14a-d to voltages at nodes $V_{Ya}$ 36, $V_{Yb}$ 38, (ii) supplies DC bias currents to the folded-cascode pair 12a-b, the class AB control pairs 16a-f, and the differential inverter input pairs 14a-d, and (iii) provides a common-mode feedback path to the first stage of the amplifier 10. The top load current-source 20a-b is coupled to the folded-cascode pair 12a-b, class AB control pairs 16a-f, and power supply VDD.

The class AB control pairs 16a-f replicate voltages at nodes $V_{Ya}$ 36 and $V_{Yb}$ 38 to voltages at nodes $V_{xa}$ 22 and $V_{xb}$ 24, respectively. Signal currents generated in the differential inverter input pairs 14a-d is converted to a voltage by a current source at nodes $V_{Ya}$ 36 and $V_{Yb}$ 38. For example, current that flows through the folded-cascode pair 12a-b is converted to a voltage at $V_{Ya}$ 36 and replicated to $V_{xa}$ 22. This conversion ensures that when $V_{Ya}$ 36 changes, $V_{xa}$ 22 follows this change.

The class AB control pairs 16a-d are biased using current sources $I_{ABa}$ 16e, $I_{ABb}$ 16f, and is coupled to the top load current source 20a-b, drains of the folded-cascode pair 12a-b, and input terminals of the class AB output pairs 16a-f.

The class AB output pairs 18a-d provide class AB and output-rail-to-rail capability. The class AB output pairs 18a-d include input terminals coupled to terminals of the class AB control pairs 16a-f. Drains of the class AB output pairs 18a-d provide outputs of the fully differential amplifier 10 at output nodes 30, 32.

The subject amplifier 10 includes a common mode feedback loop 34a-b. The common mode feedback loop 34a-b senses a common mode voltage at the output nodes 30, 32. The common mode voltage is compared with a predetermined direct current (DC) common mode voltage $V_{CM}$ 40 to determine an error signal 46. The error signal 46 is fed back to the first amplifier stage through the top load current source 20a-b.

In the architecture of the fully differential amplifier 10 with the folded-cascode pair 12a-b following the differential input pairs 14a-d, the noise performance is defined by the transconductance of a pair of single input transistors. Increasing the current flowing through the transistors, increases the transconductance, and decreases the amplifier noise. The transconductance is proportional to the current flowing through the transistor. In the subject architecture, almost all of the power is dissipated in the first stage of the amplifier, which includes the input pairs 14a-d, folded cascode pair 12a-b, and class AB control pairs 16a-f, which contributes to the transconductance of the input pairs 14a-d. As a result, power resolution as a product, is advantageously reduced. Further, in low supply voltage applications, the current sources 14e-f, 20a-b that bias the folded cascode pair 12a-b and the input pairs 14a-d contributes to a level of noise comparable with the input pair of transistors.

In some embodiments, rather than two (2) transistors (e.g., PMOS) in the input pairs 14a-d, four (4) transistors are utilized, i.e., a series combination of NMOS and PMOS transistors, which is also referred to as an inverter. The inverter may be added by itself without any other modification as shown in FIG. 3, or added in combination with additional modifications discussed herein as shown in FIGS. 1, 2, 4, and 5.

In FIG. 1., the fully differential rail-to-rail-output amplifier 10 is shown with the input pairs 14a-d and modifications to the input pairs (M0a 14a, M1a 14c, M0b 14b, M1b 14d). The class AB control pairs 16a-f are biased by one or more current source $I_{TT}$ 14e, $I_{BI}$ 14f separate from the current source biasing the input pair 14a-d, thereby increasing voltage headroom available for the folded cascode pair M2a 12a, M2b 12b.

In some embodiments, the subject amplifier 10 may alternatively be realized using PMOS devices in the input inverter pairs. The current source $I_{TT}$ is then connected between PMOS source terminals and the power supply VDD. Thus, the current source $I_{TT}$ biases the input pairs in these embodiments.

The input pairs include PMOS transistors 14a-b forming a PMOS differential pair. The PMOS transistors 14a-b are coupled to the power supply VDD through the top current source $I_{TT}$ 14e. The input pairs 14a-d also include NMOS transistors 14c-d. The PMOS transistors 14a-b are coupled to the NMOS transistors 14c-d through nodes $V_{Da}$ 42, $V_{Db}$ 44. The NMOS transistors 14c-d operate as a current sink and/or a current mirror load for the input pairs 14a-d. The PMOS transistors 14c-d may also be biased by a bias voltage.

The input pairs 14a-d drive output signals using, for example, current to the folded cascode pair M2a 12a, M2b 12b. The folded-cascode pair M2a 12a, M2b 12b provides a low impedance path for the output signal of the input pairs 14a-d. The folded cascode pair M2a 12a, M2b 12b is coupled to drains of the input pairs 14a-d, input of the class AB control pairs 16a-f, and top load current source M3a 20, M3b 20b.

The top load current source M3a 20a, M3b 20b is connected between drains of the folded-cascode pair M2a 12a, M2b 12b and the power supply VDD. The top load current source M3a 20a, M3b 20b converts signal currents generated in the differential inverter input pairs 14a-d to voltages at nodes $V_{ya}$ 36, $V_{yb}$ 38. To a first order approximation, signal current generated by the input pairs 14a-d is converted to voltage at nodes $V_{ya}$ 36, $V_{yb}$ 38 by the output impedance of the first stage load current source. However, if the input impedances of the class AB control pairs 16a-f are of the same order as the output impedance of the top load current source M3a 20a, M3b 20b, a parallel combination of these impedances converts the signal current to voltages at nodes $V_{ya}$ 36, $V_{yb}$ 38.

The folded cascode pair 12a-b, input pairs M0 14a-b, M1 14c-d, and/or class AB control pairs 16a-f form, in part, a folded cascode amplifier. For example, the folded cascode pair 12a-b may be "folded" about nodes as known in the art. The concept of cascode transistors is used to increase amplifier output impedance and provide a low-impedance path for current generated by input transistors to the output stage. As a result, this technique boosts the amplifier gain. In the subject architecture, a standard cascode transistor approach is replaced by a folded cascode technique, which provides a low-impedance path for the current generated by input transistors to the output nodes $V_{ya}$ 36, $V_{yb}$ 38 of the first amplifier stage. The folded cascode technique also increases first stage output impedance and de-desensitizes the input pair 14a-d from the effect of voltage variations to the output nodes $V_{ya}$ 36, $V_{yb}$ 38. The gates of the folded cascode are biased by voltage generated in accordance with techniques known in the art.

The NMOS transistors 12a-b may be configured as common-gate transistors. In some embodiments, gates of the NMOS transistors 12a-b may be biased by a voltage source. The NMOS transistors 12a-b provide voltages at nodes Vd0 and Vd1 as shown in FIG. 3 based on the dimensions of the transistors used, threshold voltage, current flowing through the drain and source of the folded cascode pair 12a-b, and/or bias voltage at the gates of the folded cascode pair 12a-b. The bias and cascode voltages may be generated in accordance with methods known in the art.

A biasing circuit may be configured to bias the cascode pair 12a-b with or without relying on external reference signals using techniques known in the art. For example, in some embodiments, the biasing circuit may include resistors and/or transistors. The resistors may be configured as a voltage divider configuration sourcing voltage from the power supply VDD. The resistors may further be coupled to gates of the folded-cascode pair 12a-b.

The top load current source 20a-b is connected to the common mode feedback circuit 34a-b. In some embodiments, the common mode feedback circuit or loop 34a-b is coupled to output signals $V_{OP}$ 30, $V_{ON}$ 32 to generate a common mode voltage of the output signal. Output transistors apply voltage to each output and, as a result, the current and gain of the corresponding output may be doubled. In some embodiments, the class AB control pair 16a-f generates output signals $V_{OP}$ 30, $V_{ON}$ 32.

The common mode feedback loop 34a-b senses the common mode voltage at the output nodes $V_{OP}$ 30, $V_{ON}$ 32. The common mode voltage is compared with a predetermined and/or desired DC voltage $V_{CM}$ 40 to determine an error signal. The error signal 46 is fed back to the first amplifier stage that comprises the input inverter pairs 14a-d, folded cascode pair 12a-b, and class AB control pairs 16a-f. The error signal 46 can be applied to the top current source $I_{TT}$ 14e or bottom current source $I_{BI}$ 14f in the input stage to bias current sources $I_{Aba}$ 16e, $I_{ABb}$ 16f of the class AB control pairs 16a-f.

The subject amplifier 10 may at least double the transconductance of the input pairs 14a-d and direct all or substantially all of the current flowing from the first stage of the input branch, and thus substantially less or no current is wasted. Further, the subject amplifier 10 removes noise contributions from current sources $I_{BI}$, $I_{BT}$ shown in FIGS. 1-5. In addition, the subject amplifier 10 decreases the noise contribution from parasitic source resistors $R_S$ 56 shown in FIG. 5 by at least 3 dB (or a factor of two). These improvements yield a 3 dB (or factor of two) improvement in noise reduction for the system. Thus, the subject amplifier exhibits a 3 dB (or factor of two) improvement over conventional approaches.

A method for providing the subject circuit includes 1) disconnecting Vx (now $V_{xa}$ 22, $V_{xb}$ 24) and the drain of folded cascode pair (now M2a 12a, M2b 12b) from each other; 2) coupling Vx (now $V_{xa}$ 22, $V_{xb}$ 24) to a current source 16e, 16f connected to ground; and 3) connecting drains of the folded cascode pair (now M2a 12a, M2b 12b) to Vy (now $V_{ya}$ 36, $V_{yb}$ 38). The subject circuit modifies the Class AB control pairs 16a-f in a fully differential rail-to-rail output amplifier with inverter-based input pairs of transistors 14a-d. This modification includes disconnecting Vx 22, 24 from the current source and drains of the folded cascode pair M2 12a-b, and moving drains of the folded cascode pair M2 12a-b connection to the current source Vy (now $V_{ya}$ 36, $V_{yb}$ 38).

In summary, the subject circuit 10 includes input pairs 14a-d, folded cascode pair 12a-b, class AB control pairs 16a-f, and common mode feedback loop 34a-b. The class AB control pairs 16a-f further include voltage nodes $V_{xa}$ 22, $V_{ya}$ 36, $V_{xb}$ 24, $V_{yb}$ 38. The input pairs 14a-d are configured to receive an input signal, process the input signal, and provide an input stage output signal to the class AB control pairs 16a-f. In one embodiment, the input pairs 14a-d generate an input stage output signal based on a transconductance associated with the input pairs 14a-d. The input pairs 14a-d process the input signal and provides an input stage output signal to the folded cascode pair 12a-b or the class AB control pairs 16a-d.

The folded cascode pair M2a 12a, M2b 12b generates a folded cascode pair output signal based on the input pair output signal. In one embodiment, the folded cascode pair 12a-b includes a pair of inverters. Each inverter include a pair of transistors 12a-b. In some embodiments, the folded cascode pair 12a-b generates a folded cascode pair output signal based on a voltage gain having, for example, a gain factor determined by a ratio of the folded cascode pair output signal to the input pair output signal. The conversion of current to voltage is provided by the folded cascode pair 12a-b.

The subject amplifier 10 includes the fully differential voltage amplifier, characterized by the differential inputs 26, 28 and differential outputs 30, 32. As used herein, the fully differential voltage amplifier includes an output controlled by two feedback paths 30, 32 that, because of the amplifier's high gain, determine the output voltage for any given input. Common-mode noise, such as power supply disturbances are rejected, which renders fully differential amplifiers desirable as part of a mixed-signal integrated circuit.

Figure 2:
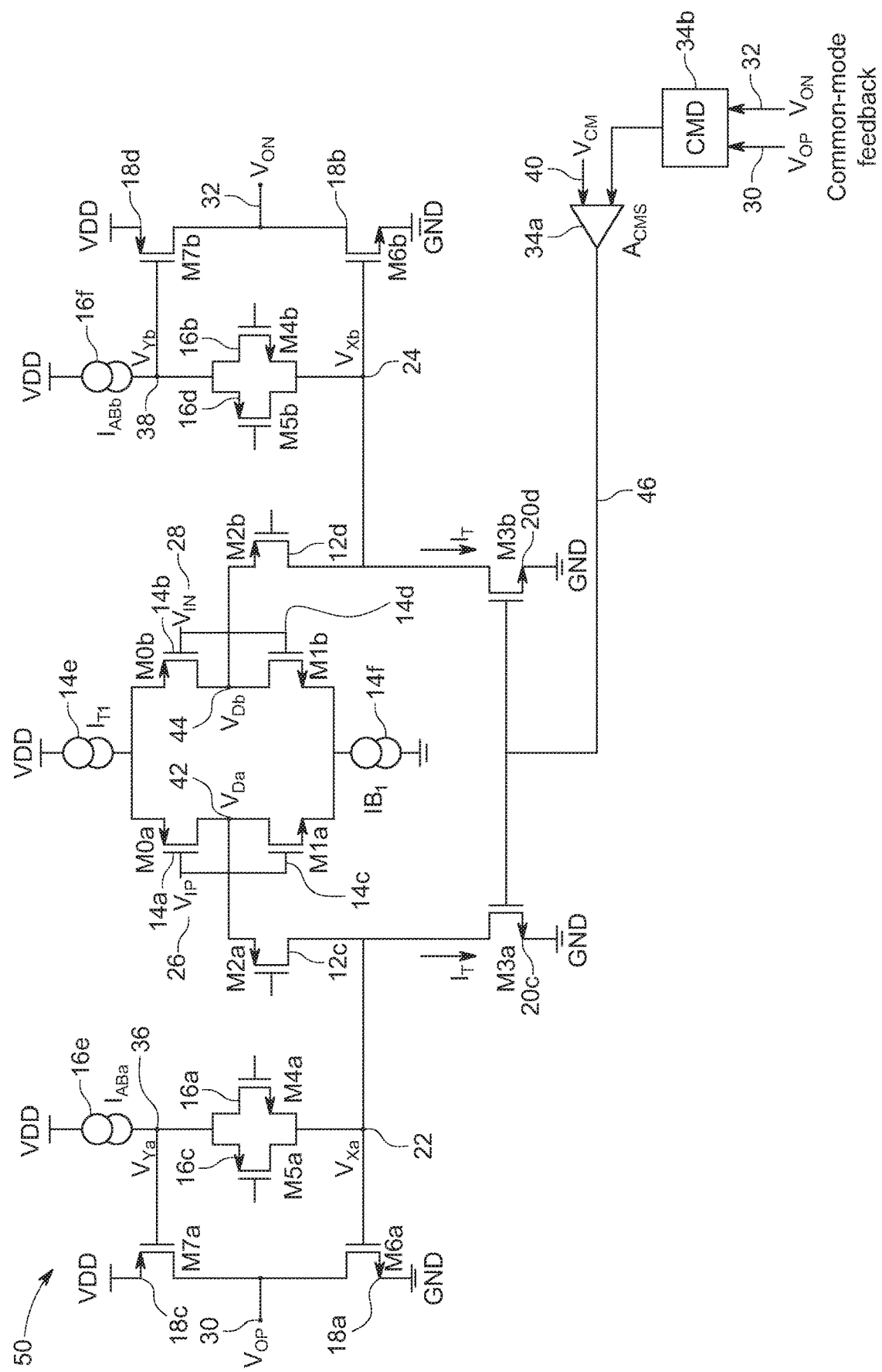
FIG. 2 is a block diagram of an embodiment of the two-stage fully differential rail-to-rail-output amplifier shown in FIG. 1, in which the folded cascode pair is realized with PMOS-type transistors.
Figure 3:
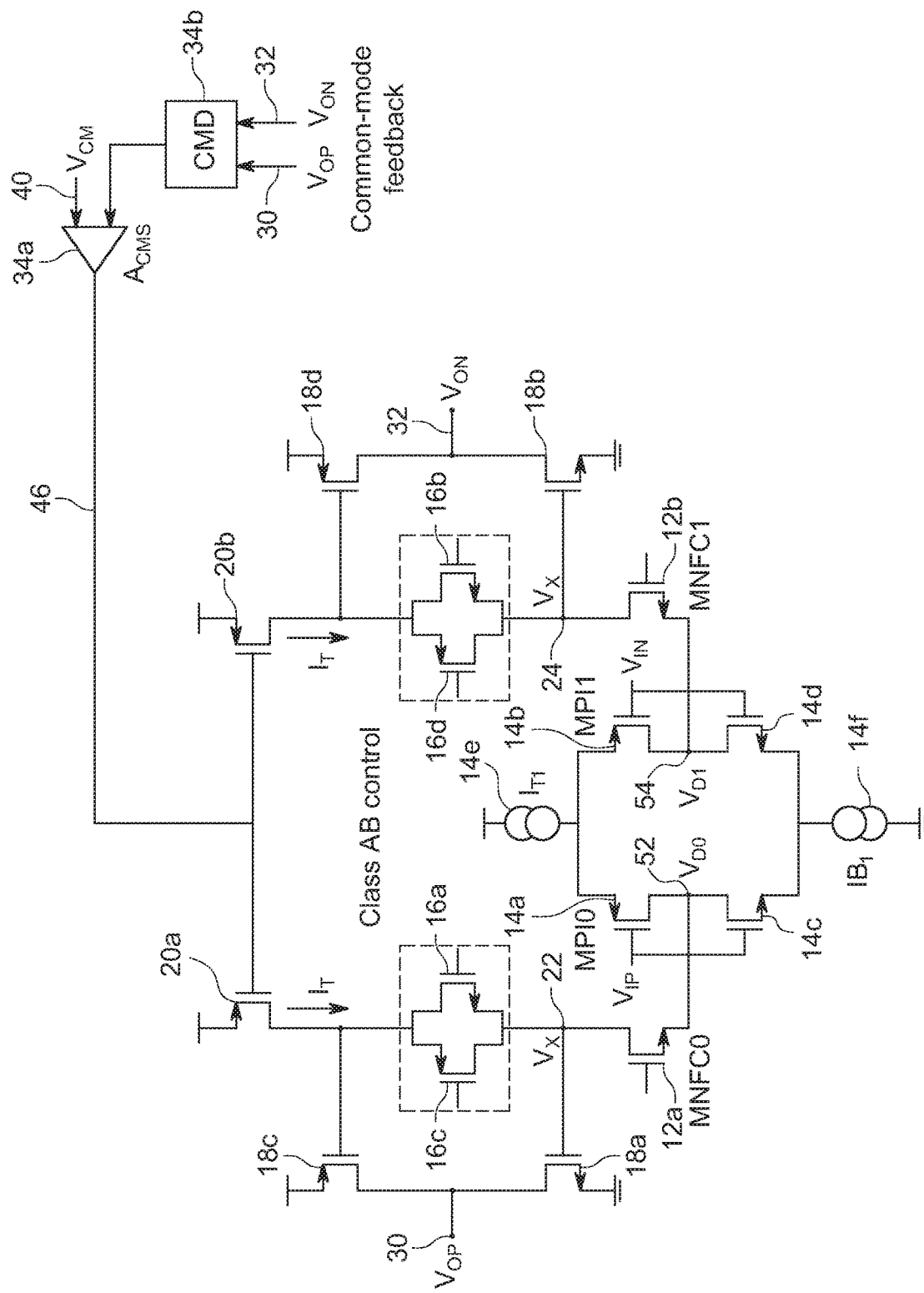
FIG. 3 is a block diagram of an embodiment of a fully differential amplifier with inverter-based input pairs.

FIG. 2 is a block diagram of another embodiment of the two-stage fully differential rail-to-rail-output amplifier 50 shown in FIG. 1, in which the folded cascode pair 12c-d is implemented using PMOS transistors 12c-d. Additional distinctions between the embodiment 10 shown in FIG. 1 and the embodiment 50 shown in FIG. 2 include biasing the class AB control pairs 16a-d using current sources $I_{ABa}$ 16e, $I_{ABb}$ 16f, which are coupled between the AB control pair transistors 16a-d and VDD, and coupling the class AB control pairs 16a-d to a bottom load current source 20c-d, which is implemented using NMOS transistors 20c-d. In addition, the bottom load current source 20c-d is coupled to the common mode feedback circuit 34a-b.

Figure 4:
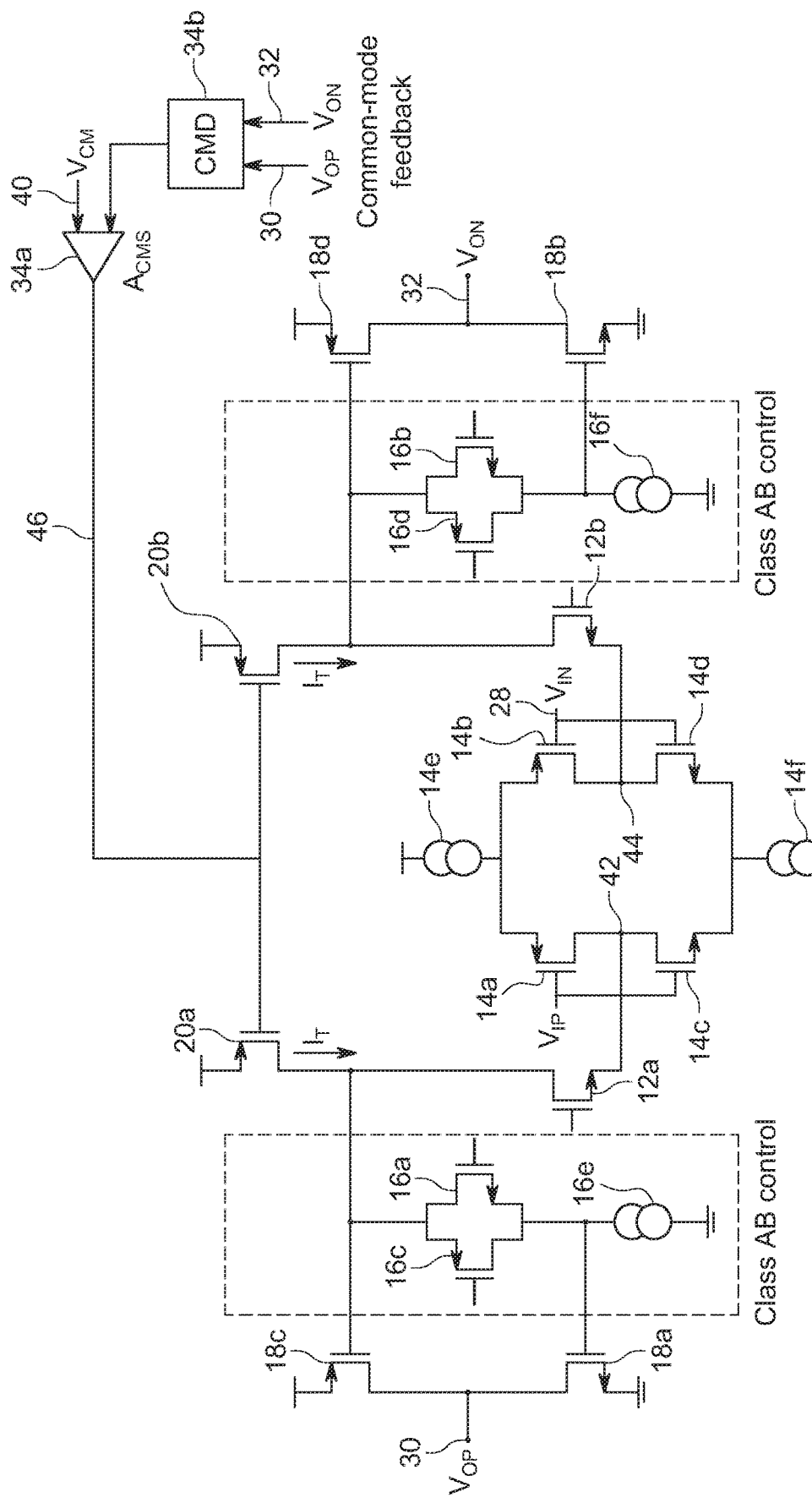
FIG. 4 is a block diagram of an embodiment of a fully differential rail-to-rail-output amplifier with the inverter-based input pairs, in which class AB control pairs are biased by a separate current source, thereby providing substantially greater voltage headroom for the folded cascode pair.
Figure 5:
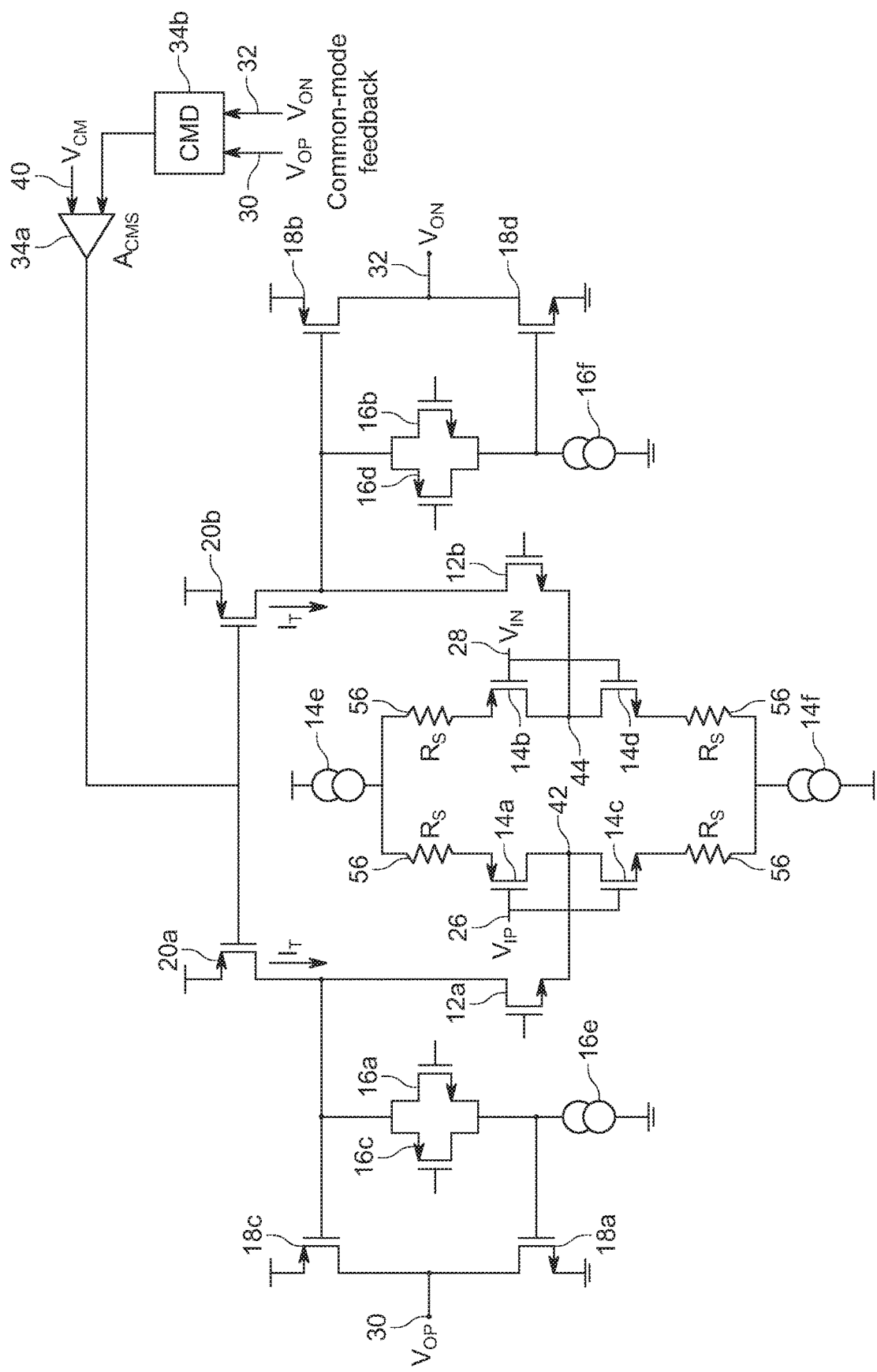
FIG. 5 is a block diagram of an embodiment of a fully differential rail-to-rail-output amplifier with the inverter-based input pairs, in which noise from a bottom bias current source is cancelled and noise from parasitic resistors $R_S$ is reduced by greater than the square root of 2 (sqrt(2)).

FIG. 3 shows a block diagram of an embodiment of the fully differential amplifier, in which only the inverter-based input pairs 14a-d have been implemented. FIG. 4 shows a block diagram of an embodiment of the fully differential rail-to-rail-output amplifier including the inverter-based input pairs 14a-d, in which the class AB control pairs 16a-d are biased using separate current sources 16e-f, thereby providing substantially greater voltage headroom for the folded cascode pair 16a-f. FIG. 5 shows a block diagram of an embodiment of the fully differential rail-to-rail-output amplifier including the inverter-based input pair 14a-d, in which noise from the bottom bias current source 14f is cancelled and noise from parasitic resistors $R_S$ 56 is reduced by greater than the square root of 2 (sqrt(2)).

It is recognized that any technically feasible combination of input pairs and folded cascode pair may be used to receive the input signal and generate the output signal. All publications and patents mentioned in the above specification are incorporated by reference in this specification. Various modifications and variations of the described detector(s) and its components will be apparent to those skilled in the art without departing from the scope and spirit of the invention. Although the disclosure has been described in connection with specific preferred embodiments, it should be understood that the invention as claimed should not be unduly limited to such specific embodiments. Indeed, those skilled in the art will recognize, or be able to ascertain using no more than routine experimentation, many equivalents to the specific embodiments of the invention described herein. Such equivalents are intended to be encompassed by the following claims.

Although the specification describes components and functions implemented in the embodiments with reference to particular standards and protocols, the embodiments are not limited to such standards and protocols.

The illustrations of embodiments described herein are intended to provide a general understanding of the structure of various embodiments, and they are not intended to serve as a complete description of all the elements and features of apparatus and systems that might make use of the structures described herein. Many other embodiments will be apparent to those of skill in the art upon reviewing the above description. Other embodiments are utilized and derived therefrom, such that structural and logical substitutions and changes are made without departing from the scope of this disclosure. Figures are also merely representational and are not drawn to scale. Certain proportions thereof are exaggerated, while others are decreased. Accordingly, the specification and drawings are to be regarded in an illustrative rather than a restrictive sense.

Embodiments are referred to herein, individually and/or collectively, by the term "embodiment" merely for convenience and without intending to voluntarily limit the scope of this application to any single embodiment or inventive concept if more than one is in fact shown. Thus, although specific embodiments have been illustrated and described herein, it should be appreciated that any arrangement calculated to achieve the same purpose are substituted for the specific embodiments shown. This disclosure is intended to cover any and all adaptations or variations of various embodiments. Combinations of the above embodiments, and other embodiments not specifically described herein, will be apparent to those of skill in the art upon reviewing the above description.

The abstract is provided to comply with 37 C.F.R. § 1.72(b), which requires an abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single embodiment. Thus, the following claims are hereby incorporated into the detailed description, with each claim standing on its own as separately claimed subject matter.

Although specific example embodiments have been described, it will be evident that various modifications and changes are made to these embodiments without departing from the broader scope of the inventive subject matter described herein. Accordingly, the specification and drawings are to be regarded in an illustrative rather than a restrictive sense. The accompanying drawings that form a part hereof, show by way of illustration, and without limitation, specific embodiments in which the subject matter are practiced. The embodiments illustrated are described in sufficient detail to enable those skilled in the art to practice the teachings herein. Other embodiments are utilized and derived therefrom, such that structural and logical substitutions and changes are made without departing from the scope of this disclosure. This detailed description, therefore, is not to be taken in a limiting sense, and the scope of various embodiments is defined only by the appended claims, along with the full range of equivalents to which such claims are entitled.

Given the teachings provided herein, one of ordinary skill in the art will be able to contemplate other implementations and applications of the techniques of the disclosed embodiments. Although illustrative embodiments have been described herein with reference to the accompanying drawings, it is to be understood that these embodiments are not limited to the disclosed embodiments, and that various other changes and modifications are made therein by one skilled in the art without departing from the scope of the appended claims.

What is claimed is:

1. A fully differential rail-to-rail-output amplifier, which comprises:
   a differential input inverter pair, the differential input inverter pair comprising at least one of an n-type channel metal-oxide semiconductor (NMOS) transistor and p-type channel metal-oxide semiconductor (PMOS) transistor and comprising bottom current source and top current source;

a folded cascode pair, the folded cascode pair comprising at least one of a NMOS transistor and PMOS transistor, the folded cascode pair operatively coupled to the differential input inverter pair;

a class AB control pair, the class AB control pair comprising at least one of a NMOS transistor, PMOS transistor, and current source, a drain of the NMOS transistor or the PMOS transistor associated with the folded cascode pair operatively coupled to the class AB control pair, the drain of the NMOS transistor or the PMOS transistor associated with the folded cascode pair being unconnected to the current source associated with the class AB control pair; and a class AB output rail-to-rail pair, the class AB output rail-to-rail pair comprising at least one of a NMOS transistor and PMOS transistor, the class AB output rail-to-rail pair operatively coupled to the class AB control pair, wherein the differential input inverter pair comprises at least two NMOS transistors and at least two PMOS transistors, sources of the PMOS transistors associated with the differential input inverter pair operatively coupled to the top current source, the top current source operatively coupled to a power supply, sources of the NMOS transistors associated with the differential input inverter pair operatively coupled to the bottom current source, the bottom current source operatively coupled to ground, drains of the PMOS transistors associated with the differential input inverter pair and drains of the NMOS transistors associated with the differential input inverter pair operatively coupled to the folded cascode pair, gates of at least one of the PMOS transistors associated with the differential input inverter pair and at least one of the NMOS transistors associated with the differential input inverter pair operatively coupled together.

2. The fully differential rail-to-rail-output amplifier, as defined by claim 1, further comprising a top load current source, the top load current source operatively coupled to the folded cascode pair.

3. The fully differential rail-to-rail-output amplifier, as defined by claim 2, wherein the top load current source comprises at least one PMOS transistor.

4. The fully differential rail-to-rail-output amplifier, as defined by claim 1, further comprising a bottom load current source, the bottom load current source operatively coupled to the folded cascode pair.

5. The fully differential rail-to-rail-output amplifier, as defined by claim 4, wherein the bottom load current source comprises at least one NMOS transistor.

6. The fully differential rail-to-rail-output amplifier, as defined by claim 2, further comprising a common mode feedback circuit, the common mode feedback circuit operatively coupled to the top load current source.

7. The fully differential rail-to-rail-output amplifier, as defined by claim 6, wherein the common mode feedback circuit comprises at least one of a differential-input single-ended output amplifier and common mode detection circuit.

8. The fully differential rail-to-rail-output amplifier, as defined by claim 4, further comprising a common mode feedback circuit, the common mode feedback circuit operatively coupled to the bottom load current source.

9. The fully differential rail-to-rail-output amplifier, as defined by claim 8, wherein the common mode feedback circuit comprises at least one of a differential-input single-ended output amplifier and common mode detection circuit.

10. The fully differential rail-to-rail-output amplifier, as defined by claim 1, wherein the folded cascode pair comprises at least two NMOS transistors, sources of the NMOS transistors associated with the folded cascode pair operatively coupled to the differential input inverter pair, at least one drain of the NMOS transistors associated with the folded cascode pair operatively coupled to the class AB control pair.

11. The fully differential rail-to-rail-output amplifier, as defined by claim 1, wherein the folded cascode pair comprises at least two PMOS transistors, sources of the PMOS transistors associated with the folded cascode pair operatively coupled to the differential input inverter pair, at least one drain of the PMOS transistors associated with the folded cascode pair operatively coupled to the class AB control pair.

12. The fully differential rail-to-rail-output amplifier, as defined by claim 1, wherein a source of the PMOS transistor associated with the class AB control pair and a drain of the NMOS transistor associated with the class AB control pair are operatively coupled to the folded cascode pair, a drain of the PMOS transistor associated with the class AB control pair and a source of the NMOS transistor associated with the class AB control pair operatively coupled to the current source associated with the AB control pair, the current source associated with the class AB control pair operatively coupled to ground.

13. The fully differential rail-to-rail-output amplifier, as defined by claim 1, wherein a source of the PMOS transistor associated with the class AB control pair and a drain of the NMOS transistor associated with the class AB control pair are operatively coupled to the folded cascode pair, a drain of the PMOS transistor associated with the class AB control pair and a source of the NMOS transistor associated with the class AB control pair operatively coupled to the current source associated with the AB control pair, the current source associated with the class AB control pair operatively coupled to a power supply.

14. The fully differential rail-to-rail-output amplifier, as defined by claim 1, wherein a drain of the PMOS transistor associated with the class AB output rail-to-rail pair is operatively coupled to a drain of the NMOS transistor associated with the class AB output rail-to-rail pair, a gate of the PMOS transistor associated with the class AB output rail-to-rail pair operatively coupled to the class AB control pair, a gate of the NMOS transistor associated with the class AB output rail-to-rail pair operatively coupled to the class AB control pair.

15. The fully differential rail-to-rail-output amplifier, as defined by claim 2, wherein the top load current source comprises at least two PMOS transistors, gates of the PMOS transistors associated with the top load current source operatively coupled together, sources of the PMOS transistors associated with the top load current source operatively coupled to a power supply, drains of the PMOS transistors associated with the top load current source operatively coupled to the folded cascode pair.

16. The fully differential rail-to-rail-output amplifier, as defined by claim 4, wherein the bottom load current source comprises at least two NMOS transistors, gates of the NMOS transistors associated with the bottom load current source operatively coupled together, sources of the NMOS transistors associated with the top load current source operatively coupled to ground, drains of the NMOS transistors associated with the top load current source operatively coupled to the folded cascode pair.

17. The fully differential rail-to-rail-output amplifier, as defined by claim 7, wherein the common mode detection circuit is operatively coupled to drains of the PMOS transistor and the NMOS transistor associated with the class AB output rail-to-rail pair and the differential-input single-ended output amplifier, the differential-input single-ended output amplifier operatively coupled to the top load current source and a direct current (DC) common mode voltage $V_{CM}$.

18. The fully differential rail-to-rail-output amplifier, as defined by claim 9, wherein the common mode detection circuit is operatively coupled to drains of the PMOS transistor and NMOS transistor associated with the class AB output rail-to-rail pair and the differential-input single-ended output amplifier, the differential-input single-ended amplifier operatively coupled to the bottom load current source and a direct current (DC) common mode voltage $V_{CM}$.

19. A method of providing fully differential rail-to-rail-output amplification, which comprises:
 coupling a folded cascode pair operatively to a differential input inverter pair, the folded cascode pair comprising at least one of a n-type channel metal oxide semiconductor (NMOS) transistor and p-type channel metal oxide semiconductor (PMOS) transistor, the differential input inverter pair comprising at least one of a NMOS transistor and PMOS transistor and comprising bottom current source and top current source;
 coupling a drain of the NMOS transistor or the PMOS transistor associated with the folded cascode pair operatively to a class AB control pair, the drain of the NMOS transistor or the PMOS transistor associated with the folded cascode pair being unconnected to a current source associated with the class AB control pair, the class AB control pair comprising at least one of a NMOS transistor, PMOS transistor, and current source; and
 coupling a class AB output rail-to-rail pair operatively to the class AB control pair, the class AB output rail-to-rail pair comprising at least one of a NMOS transistor and PMOS transistor,
 wherein the differential input inverter pair comprises at least two NMOS transistors and at least two PMOS transistors, sources of the PMOS transistors associated with the differential input inverter pair operatively coupled to the top current source, the top current source operatively coupled to a power supply, sources of the NMOS transistors associated with the differential input inverter pair operatively coupled to the bottom current source, the bottom current source operatively coupled to ground, drains of the PMOS transistors associated with the differential input inverter pair and drains of the NMOS transistors associated with the differential input inverter pair operatively coupled to the folded cascode pair, gates of at least one of the PMOS transistors associated with the differential input inverter pair and at least one of the NMOS transistors associated with the differential input inverter pair operatively coupled together.

* * * * *